United States Patent
Suzuki

(10) Patent No.: US 7,432,195 B2
(45) Date of Patent: Oct. 7, 2008

(54) METHOD FOR INTEGRATING A CONFORMAL RUTHENIUM LAYER INTO COPPER METALLIZATION OF HIGH ASPECT RATIO FEATURES

(75) Inventor: Kenji Suzuki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 153 days.

(21) Appl. No.: 11/277,908

(22) Filed: Mar. 29, 2006

(65) Prior Publication Data
US 2007/0238288 A1 Oct. 11, 2007

(51) Int. Cl.
*H01L 21/44* (2006.01)

(52) U.S. Cl. .......... 438/654; 257/E21.17; 257/E21.311; 438/681; 438/733

(58) Field of Classification Search ................. 438/654, 438/681, 686, 733, 742; 257/E21.496, E21.17, 257/E21.218, E21.311
See application file for complete search history.

(56) References Cited

U.S. PATENT DOCUMENTS

| | | | |
|---|---|---|---|
| 4,190,965 | A | 3/1980 | Erickson |
| 5,914,001 | A | 6/1999 | Hansen |
| 6,270,839 | B1 | 8/2001 | Onoe et al. |
| 6,287,435 | B1 | 9/2001 | Drewery et al. |
| 6,544,345 | B1 | 4/2003 | Mayer et al. |
| 6,921,062 | B2 | 7/2005 | Gregg et al. |
| 7,107,998 | B2 * | 9/2006 | Greer et al. ............... 134/22.1 |
| 7,217,651 | B2 * | 5/2007 | Sir et al. .................. 438/622 |
| 2004/0105934 | A1 | 6/2004 | Chang et al. |
| 2005/0074968 | A1 | 4/2005 | Chen et al. |
| 2005/0263891 | A1 | 12/2005 | Lee et al. |
| 2006/0024953 | A1 * | 2/2006 | Papa Rao et al. ......... 438/629 |
| 2006/0125100 | A1 * | 6/2006 | Arakawa ................... 257/758 |

(Continued)

FOREIGN PATENT DOCUMENTS

WO   WO2004010463 A2   1/2004

(Continued)

OTHER PUBLICATIONS

European Patent Office, Invitation to Pay Additional Fees received in corresponding PCT Application No. PCT/US007/063570, dated Aug. 24, 2007, 4 pgs.

(Continued)

*Primary Examiner*—Caridad M Everhart
(74) *Attorney, Agent, or Firm*—Wood, Herron & Evans, LLP

(57) ABSTRACT

A method of integrated processing of a patterned substrate for copper metallization. The method includes providing the patterned substrate containing a via and a trench in a vacuum processing tool, and performing an integrated process on the patterned substrate in the vacuum processing tool by depositing a first metal-containing layer over the patterned substrate, removing by sputter etching the first metal-containing layer from the bottom of the via and at least partially removing the first metal-containing layer from the bottom of the trench, depositing a conformal Ru layer onto the sputter etched first metal-containing layer, depositing a non-conformal Cu layer on the conformal Ru layer, and plating Cu over the patterned substrate. According to one embodiment of the invention, the method can further include depositing a second metal-containing layer onto the sputter etched first metal-containing layer prior to depositing the conformal Ru layer.

27 Claims, 12 Drawing Sheets

U.S. PATENT DOCUMENTS

2006/0199372 A1* 9/2006 Chung et al. .......... 438/628
2007/0099422 A1* 5/2007 Wijekoon et al. .......... 438/687
2007/0117371 A1* 5/2007 Engbrecht et al. .......... 438/622

FOREIGN PATENT DOCUMENTS

WO    WO2004011695 A2    3/2005

OTHER PUBLICATIONS

European Patent Office, International Search Report and Written Opinion received in corresponding PCT Application No. PCT/US2007/063570, dated Oct. 29, 2007, 14 pgs.

* cited by examiner

METHOD FOR INTEGRATING A CONFORMAL RUTHENIUM LAYER INTO COPPER METALLIZATION OF HIGH ASPECT RATIO FEATURES

FIELD OF THE INVENTION

The present invention relates to semiconductor processing and semiconductor devices, and more particularly, to a method of integrating a conformal ruthenium (Ru) layer into copper metallization of high aspect ratio features used in semiconductor devices.

BACKGROUND OF THE INVENTION

An integrated circuit contains various semiconductor devices and a plurality of conducting metal paths that provide electrical power to the semiconductor devices and allow these semiconductor devices to share and exchange information. Within the integrated circuit, metal layers are stacked on top of one another using intermetal or interlayer dielectric layers that insulate the metal layers from each other.

Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect. Metal layers typically occupy etched pathways in the interlayer dielectric. A "via" normally refers to any feature such as a hole, line or other similar feature formed within a dielectric layer that provides an electrical connection through the dielectric layer to a conductive layer underlying the dielectric layer. Similarly, metal layers connecting two or more vias are normally referred to as trenches.

The use of copper (Cu) metal in multilayer metallization schemes for manufacturing integrated circuits creates problems due to high mobility of Cu atoms in dielectrics, such as $SiO_2$, and Cu atoms may create electrical defects in Si. Thus, Cu metal layers, Cu filled trenches, and Cu filled vias are normally encapsulated with a barrier material to prevent Cu atoms from diffusing into the dielectrics and Si. Barrier layers are normally deposited on trench and via sidewalls and bottoms prior to Cu seed deposition, and may include materials that are preferably non-reactive and immiscible in Cu, provide good adhesion to the dielectrics and can offer low electrical resistivity.

An increase in device performance is normally accompanied by a decrease in device area or an increase in device density. An increase in device density requires a decrease in via dimensions used to form interconnects, including a larger aspect ratio (i.e., depth to width ratio). As via dimensions decrease, and aspect ratios increase, it becomes increasingly more challenging to form diffusion barrier layers with adequate thickness on the sidewalls of the vias. In addition, as via and trench dimensions decrease and the thicknesses of the layers in the vias and trenches decrease, the material properties of the layers and the layer interfaces become increasingly more important. In particular, the processes forming those layers need to be carefully integrated into a manufacturable process sequence where good control is maintained for all the steps of the process sequence.

SUMMARY OF THE INVENTION

Embodiments of the invention provide a method for integrating a conformal Ru layer into copper metallization of high aspect ratio features.

According to one embodiment of the invention, the method includes providing a patterned substrate containing a via and a trench in a vacuum processing tool, and performing an integrated process on the patterned substrate in the vacuum processing tool. The integrated process includes depositing a first metal-containing layer over the patterned substrate, removing by sputter etching the first metal-containing layer substantially completely from the bottom of the via and at least partially removing the first metal-containing layer from the bottom of the trench, depositing a conformal Ru layer onto the sputter etched first metal-containing layer, depositing a non-conformal Cu layer onto the conformal Ru layer, and plating bulk Cu over the patterned substrate.

According to another embodiment of the invention, the method includes providing a patterned substrate containing a via and a trench in a vacuum processing tool, and performing an integrated process on the patterned substrate in the vacuum processing tool. The integrated process includes depositing a first metal-containing layer over the patterned substrate, removing by sputter etching the first metal-containing layer substantially completely from the bottom of the via and from the bottom of the trench, depositing a second metal-containing layer onto the sputter etched first metal-containing layer, depositing a conformal Ru layer onto the sputter etched first metal-containing layer in a thermal chemical vapor deposition process using a process gas containing $Ru_3(CO)_{12}$ vapor and CO gas, and depositing non-conformal Cu layer on the conformal Ru layer.

According to embodiments of the invention, the depositing a first metal-containing layer is performed in a first processing system, the removing is performed in a second processing system or the first processing system, the depositing a second metal-containing layer is performed in the first processing system or the second processing system, the depositing a conformal Ru layer is performed in a third processing system, and the depositing a non-conformal Cu layer is performed in a fourth processing system. The first, second, third and fourth processing systems are coupled in the vacuum processing tool to a robotic transfer system that transfers the patterned substrate between the processing systems under vacuum.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS OF THE INVENTION

Figure 1:
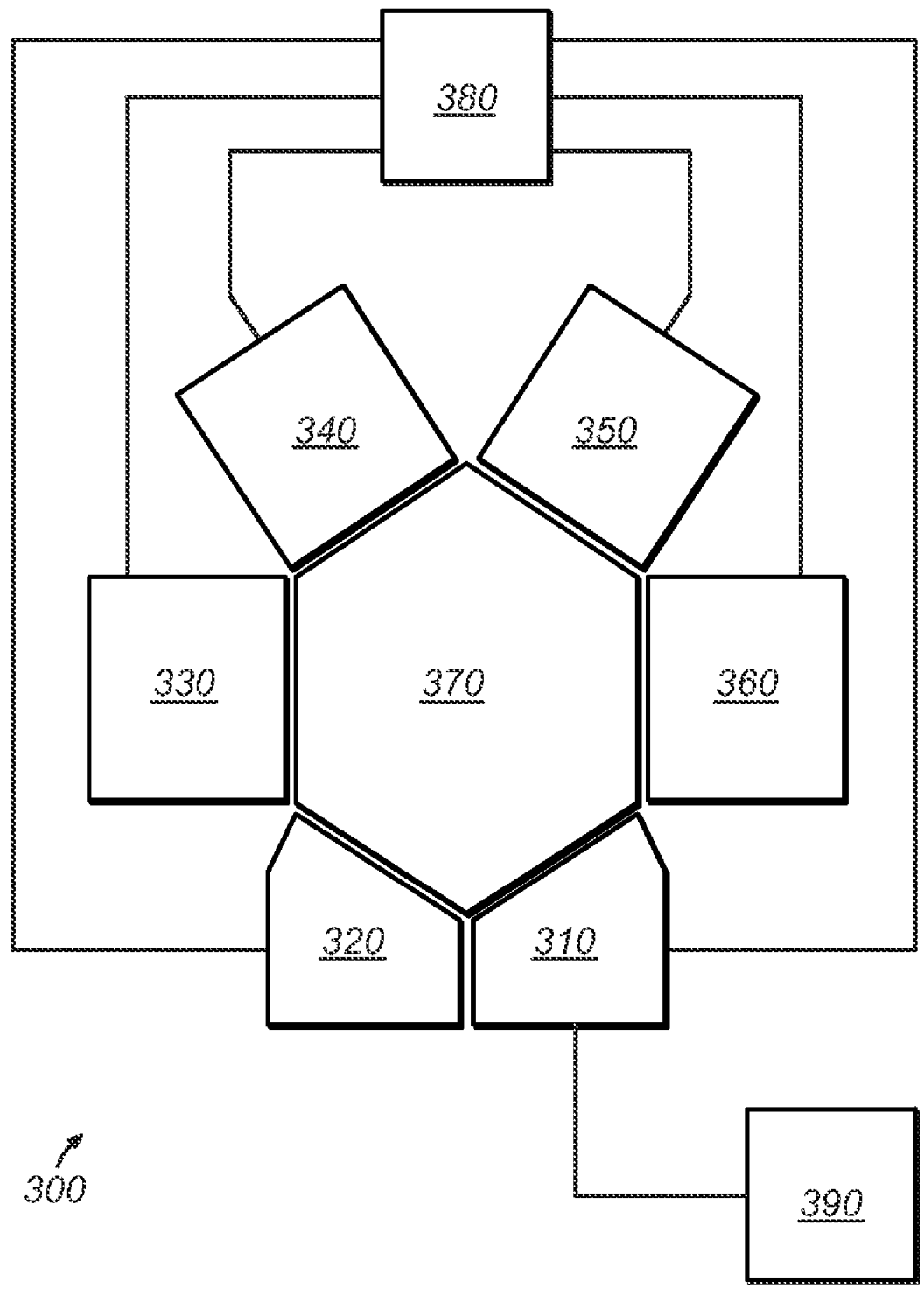
FIG. 1 depicts a schematic view of a vacuum processing tool for processing a patterned substrate according to embodiments of the invention.

In the following description, in order to facilitate a thorough understanding of the invention and for purposes of explanation and not limitation, specific details are set forth, such as a particular geometry of processing systems and a vacuum processing tool and descriptions of various components. However, it should be understood that the invention may be practiced in other embodiments that depart from these specific details.

Embodiments of the invention provide a system and method for integrating a conformal Ru layer into copper metallization of a semiconductor device containing a patterned substrate with high aspect ratio features. The dual damascene patterned substrate contains a trench and a via formed in the patterned substrate, where the trench and the via contain sidewalls and bottoms. The via can have an aspect ratio (depth/width) greater than or equal to about 2:1, for example 3:1, 4:1, 5:1, 6:1, 12:1, 15:1, or higher. The via can have widths of about 200 nm or less, for example 150 nm, 100 nm, 65 nm, 32 nm, 20 nm, or lower. However, embodiments of the invention are not limited to these aspect ratios or via widths, as other aspect ratios or via widths may be utilized. Often, aspect ratios of at least 5:1 are referred to as "high" aspect ratios.

According to one embodiment of the invention, the method includes providing a patterned substrate in a vacuum processing tool, where the patterned substrate contains a via and a trench, and performing an integrated process on the patterned substrate in the vacuum processing tool. In particular, a first metal-containing layer is deposited onto the patterned substrate and, thereafter, the first metal-containing layer is substantially completely removed by sputter etching from the bottom of the via and at least partially removed from the bottom of the trench. Removal of the first metal-containing layer from the bottom of the via provides low electrical resistance to a metal layer at the bottom of the via and bulk copper to be deposited over the patterned substrate. Next, a conformal Ru layer is deposited. In an exemplary embodiment, the Ru layer is deposited in a thermal chemical vapor deposition process using a process gas containing $Ru_3(CO)_{12}$ vapor and CO gas. The Cu metallization is then formed over the Ru layer filling both the via and trench. For the Cu metallization, in an exemplary embodiment, a non-conformal Cu layer is deposited on the conformal Ru layer, and subsequently, the patterned substrate is exposed to air and the feature (via and trench) filled with bulk Cu (e.g., by a Cu plating process) and planarized (e.g., by chemical mechanical polishing (CMP)). Alternately, the patterned substrate may be filled with bulk Cu by sputter deposition or chemical vapor deposition without exposing the patterned substrate to air. According to another embodiment of the invention, a second metal-containing layer is deposited onto the sputter etched first metal-containing layer, a conformal Ru layer is deposited onto the second metal-containing layer, and a non-conformal Cu layer is deposited on the conformal Ru layer.

A patterned substrate processed according to embodiments of the invention contains a conformal Ru layer that provides conformal coverage over high aspect ratio features, and provides, in combination with one or more underlying metal-containing layers, good diffusion barrier properties and good adhesion to bulk Cu layer filling the high aspect ratio features.

Embodiments of the invention provide integration of different "unit" processes under well-controlled processing conditions. Unit processes can include processes for depositing different material layers on a substrate. Such unit processes are frequently performed in different processing systems where the patterned substrate (wafer) may exposed to air as it is transported from one processing system to the next. According to an embodiment of the invention, unit processes that include deposition of a first metal-containing layer, sputter etching of the first metal-containing layer, deposition of a second metal-containing layer, deposition of a conformal Ru layer, and deposition of a non-conformal Cu layer, are performed in sequence without air exposure in a vacuum processing tool, thereby avoiding air exposure that may be detrimental to the different material layers deposited by the unit processes and improving the properties of the interfaces between the different material layers.

FIG. 1 depicts a schematic view of a vacuum processing tool for processing a patterned substrate according to embodiments of the invention. The vacuum processing tool 300 contains substrate loading chambers 310 and 320, processing systems 330-360, robotic transfer system 370, and controller 380. According to an embodiment of the invention, the vacuum processing tool 300 allows for processing the patterned substrate without exposure to air during the processing.

The substrate loading chambers 310 and 320 are utilized for transferring patterned substrates into the vacuum processing tool 300 for processing and out of the vacuum processing tool 300 following processing. Since the vacuum processing tool 300 is normally under vacuum, the substrate loading chambers 310 and 320 are configured to evacuate substrates disposed into the vacuum processing tool 300. As shown in FIG. 1, the substrate loading chambers 310 and 320 are coupled to the robotic transfer system 370. The robotic transfer system 370 is configured for transferring substrates between the substrate loading chambers 310 and 320 and the processing systems 330-360. The robotic transfer system 370 can, for example, be purged with an inert gas such as Ar under vacuum conditions (e.g., about 100 mTorr or less).

According to an embodiment of the invention, the processing system 330 can be configured for depositing a first metal-containing layer, such as a Ta-containing layer (e.g., TaC, TaN, TaCN), a Ti-containing layer (e.g., Ti, TiN), or a W-containing layer (e.g., W, WN). The processing system 340 can be configured for depositing a second metal-containing layer, such as a Ta, Ti, TiN, TaC, TaCN, W, or WN. The processing system 350 can be configured for depositing a conformal Ru layer by a chemical vapor deposition process, and the processing system 360 can be configured for depositing a non-conformal Cu layer.

Although not shown in FIG. 1, those skilled in the art will readily realize that the vacuum processing tool 300 may also contain a degassing system and a pre-clean system. Degassing may be carried out following evacuation when the patterned substrate is disposed in the vacuum processing tool 300. The degassing can, for example, be performed by heating the substrate to a temperature between about 100° C. and about 500° C. in the presence of an inert gas such as Ar. Pre-cleaning may include light plasma cleaning of the patterned substrate. Furthermore, the vacuum processing tool 300 may also contain a cool-down system configured for cooling a processed substrate, and a substrate aligning system.

Following degassing and/or pre-cleaning, the patterned substrate is transported by the robotic transfer system 370 to the processing system 330 for depositing a first metal-containing layer. According to one embodiment of the invention, the processing system 330 can be configured to carry out physical vapor deposition (PVD) of a Ta-containing layer (e.g., TaC, TaN, TaCN), a Ti-containing layer (e.g., Ti, TiN), or a W-containing layer (e.g., W, WN). In one example, the first metal-containing layer can be deposited from a sputtering target using a nitrogen-containing gas (e.g., $NH_3$ or $N_2$) in a plasma. In another example, the processing system 330 can be configured to carry out ionized physical vapor deposition (IPVD) of the first metal-containing layer. One example of an IPVD system is described in U.S. Pat. No. 6,287,435. In yet another example, the processing system 330 can be configured to deposit the first metal-containing layer by plasma-enhanced chemical vapor deposition (PECVD) or by a plasma-enhanced atomic layer deposition (PEALD) process (e.g., using alternating steps of adsorbing a metal-containing precursor on a surface of a substrate and exposing the adsorbed metal-containing precursor to a reducing plasma). One example of a PEALD processing system is described in U.S. patent application Ser. No. 11/083,899, filed on Mar. 21, 2005. According to one embodiment of the invention, the processing system 330 can be configured for depositing a TaCN first metal-containing layer by a PEALD process that includes alternating exposures of TAIMATA and plasma-excited hydrogen. In still another example, the processing system 330 can be configured to carry out thermal chemical vapor deposition (TCVD) of the first metal-containing layer.

According to one embodiment of the invention, the processing system 330 can be further configured for sputter etching the deposited first metal-containing layer to remove the first metal-containing layer from the bottom of a via and to at least partially remove the first metal-containing layer from the bottom of a trench.

Following deposition and sputter etching of the first metal-containing layer, the substrate may be transported by the robotic transfer system 370 to the processing system 340 for depositing a second metal-containing layer onto the sputter etched first metal-containing layer. According to one embodiment of the invention, the processing system 340 can be configured to carry out PVD or IPVD of a Ta layer, a Ti layer, or a W layer. According to another embodiment of the invention, a TaCN second metal-containing layer may be deposited by a PEALD process in processing system 340. According to still another embodiment of the invention, the processing system 340 can be configured for conformally depositing a second metal-containing layer by thermal chemical vapor deposition (TCVD) or ALD. According to yet another embodiment of the invention, deposition of the second metal-containing layer may be omitted. According to one embodiment of the invention, the processing system 340 can be configured for sputter etching the first metal-containing layer deposited in processing system 330.

Next, the substrate is transported by the robotic transfer system 370 to the processing system 350 for depositing a conformal Ru layer, for example, in a thermal chemical vapor deposition process using a process gas containing $Ru_3(CO)_{12}$ and CO. The processing system 350 can, for example, be one of the deposition systems 1, 100 depicted in FIGS. 2, 3.

Following deposition of the conformal Ru layer in the processing system 350, the patterned substrate may be transported by the robotic transfer system 370 to the processing system 360 to deposit a non-conformal Cu layer on the conformal Ru layer. The non-conformal Cu layer can have a thickness between 1 and 50 nm. The processing system 360 can, for example, be an IPVD system configured for depositing the non-conformal Cu layer. According to one embodiment of the invention, the processing system 360 can be configured for sputter etching the first metal-containing layer.

A plating system 390 is operatively coupled to the vacuum processing tool 300 through the substrate loading chamber 310. The plating system 390 can, for example, be configured for performing an electrochemical or electroless plating process for plating a bulk Cu layer. Electrochemical and electroless plating systems are well known to those skilled in the art and are readily available commercially. Normally, the vacuum processing tool 300 is configured to expose the substrate to air during transfer from the substrate loading chamber 310 to plating system 390.

The vacuum processing tool 300 can be controlled by a controller 380. The controller 380 can be coupled to and exchange information with substrate loading chambers 310 and 320, processing systems 330-360, and robotic transfer system 370. The controller 380 can operate substrate transfer operations within the vacuum processing tool 300 and substrate processing performed within the processing systems 330-360. In one example, the controller 380 can further control the plating system 390. In another example, the plating system 390 can contain a separate controller for controlling the functions of the plating system 390. In one embodiment of the invention, the controller 380 can be programmed through a program stored in the memory of the controller 380 to perform processes of embodiments of the invention and any functions associated with monitoring the processes. The controller 380 may be a systems controller, a dedicated hardware circuit, or a programmed general purpose computer, such as a DELL PRECISION WORKSTATION 610™, available from Dell Corporation, Austin, Tex.

Figure 2:
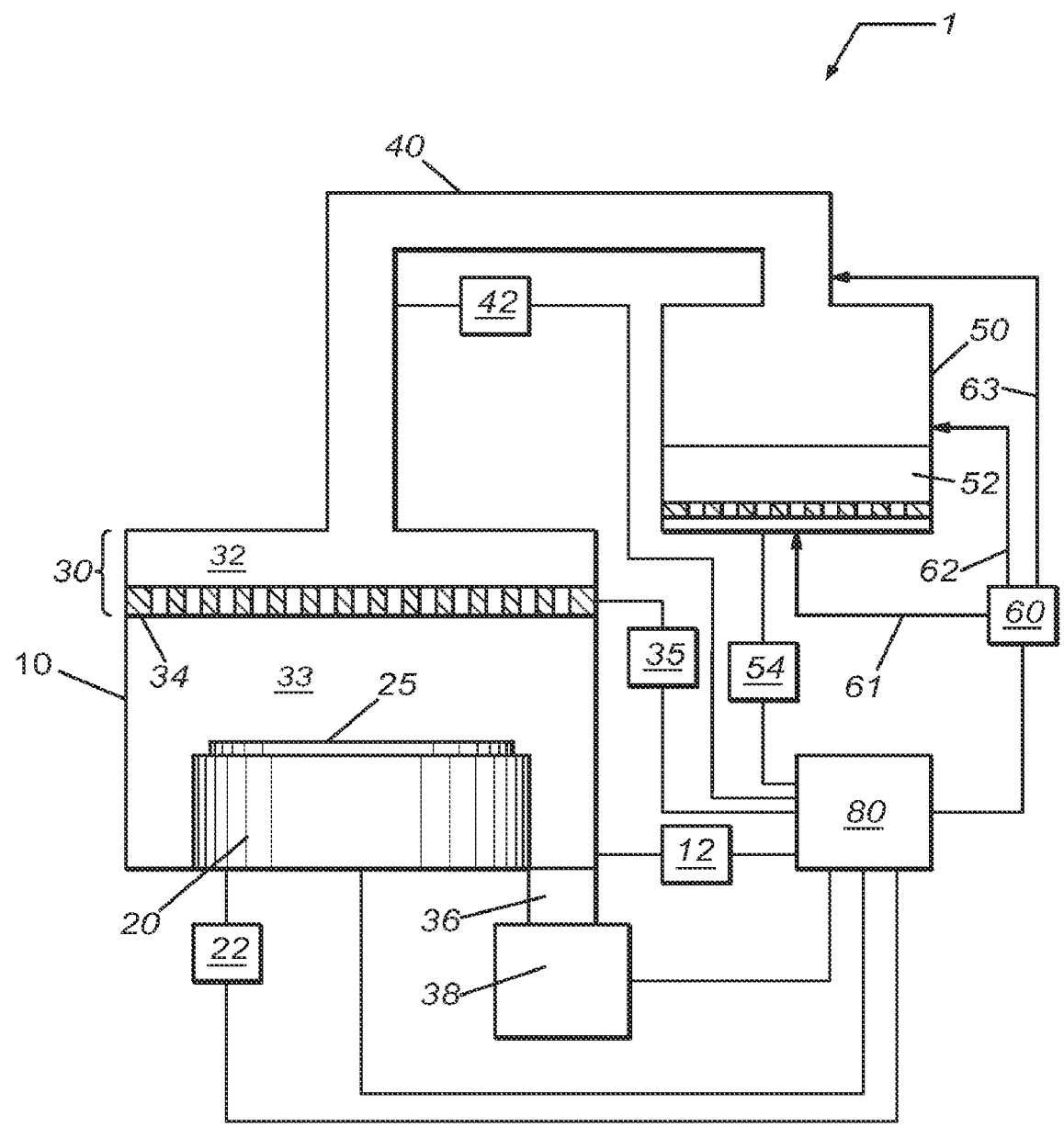
FIG. 2 depicts a schematic view of a thermal chemical vapor deposition (TCVD) system for depositing a Ru adhesion layer according to an embodiment of the invention.

FIG. 2 depicts a schematic view of a thermal chemical vapor deposition (TCVD) system for depositing a Ru adhesion layer from a $Ru_3(CO)_{12}$ precursor according to an embodiment of the invention. It should be understood, however, that Ru precursors other than $Ru_3(CO)_{12}$ may be used in embodiments of the present invention. The processing system 1 includes a process chamber 10 having a substrate holder 20 configured to support a substrate 25 upon which the ruthenium metal layer is formed. The process chamber 10 is coupled to a metal precursor vaporization system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and metal precursor vaporization system 50 to a pressure suitable for forming the conformal Ru metal layer on the substrate 25, and suitable for vaporization of the $Ru_3(CO)_{12}$ precursor 52 in the metal precursor vaporization system 50.

Still referring to FIG. 2, the metal precursor vaporization system 50 is configured to store a $Ru_3(CO)_{12}$ precursor 52, to heat the $Ru_3(CO)_{12}$ precursor 52 to a temperature sufficient for vaporizing the $Ru_3(CO)_{12}$ precursor 52, and to introduce $Ru_3(CO)_{12}$ precursor vapor to the vapor precursor delivery system 40. The $Ru_3(CO)_{12}$ precursor 52 is a solid under the selected heating conditions in the metal precursor vaporization system 50. In order to achieve the desired temperature for subliming the solid $Ru_3(CO)_{12}$ precursor 52, the metal precursor vaporization system 50 is coupled to a vaporization temperature control system 54 configured to control the vaporization temperature. For instance, the temperature of the $Ru_3(CO)_{12}$ precursor 52 is generally elevated to approximately 40° C. to approximately 45° C. in conventional systems in order to sublime the $Ru_3(CO)_{12}$. At this temperature, the vapor pressure of the $Ru_3(CO)_{12}$, for instance, ranges from approximately 1 to approximately 3 mtorr. As the $Ru_3$ (CO)$_{12}$ precursor 52 is heated to cause sublimation, a CO-containing gas can be passed over or through the Ru$_3$(CO)$_{12}$ precursor 52, or a combination thereof. The CO-containing gas contains CO and optionally an inert carrier gas, such as N$_2$, or a noble gas (i.e., He, Ne, Ar, Kr, or Xe), or a combination thereof. In one example, the metal precursor vaporization system 50 may be a multi-tray vaporization system configured for efficient evaporation and transport of the Ru$_3$(CO)$_{12}$ vapor. An exemplary multi-tray vaporization system is described in U.S. patent application Ser. No. 10/998,420, titled "Multi-Tray Film Precursor Evaporation System and Thin Film Deposition System Incorporating Same", filed on Nov. 29, 2004.

For example, a gas supply system 60 is coupled to the metal precursor vaporization system 50, and it is configured to, for instance, supply CO, a carrier gas, or a mixture thereof, beneath the Ru$_3$(CO)$_{12}$ precursor 52 via feed line 61, or over the Ru$_3$(CO)$_{12}$ precursor 52 via feed line 62. In addition, or in the alternative, the gas supply system 60 is coupled to the vapor precursor delivery system 40 downstream from the metal precursor vaporization system 50 to supply the gas to the vapor of the Ru$_3$(CO)$_{12}$ precursor 52 via feed line 63 as or after it enters the vapor precursor delivery system 40. Although not shown, the gas supply system 60 can comprise a carrier gas source, a CO gas source, one or more control valves, one or more filters, and a mass flow controller. For instance, the flow rate of the CO-containing gas can be between about 0.1 standard cubic centimeters per minute (sccm) and about 1000 sccm. Alternately, the flow rate of the CO-containing gas can be between about 10 sccm and about 500 sccm. Still alternately, the flow rate of the CO-containing gas can be between about 50 sccm and about 200 sccm. According to embodiments of the invention, the flow rate of the CO-containing gas can range from approximately 0.1 sccm to approximately 1000 sccm. Alternately, the flow rate of the CO-containing gas can be between about 1 sccm and about 500 sccm.

Downstream from the metal precursor vaporization system 50, the process gas containing the Ru$_3$(CO)$_{12}$ precursor vapor flows through the vapor precursor delivery system 40 until it enters the process chamber 10 via a vapor distribution system 30 coupled thereto. The vapor precursor delivery system 40 can be coupled to a vapor line temperature control system 42 in order to control the vapor line temperature and prevent decomposition of the Ru$_3$(CO)$_{12}$ precursor vapor as well as condensation of the Ru$_3$(CO)$_{12}$ precursor vapor. The vapor precursor delivery system 40 can, for example, be maintained at a temperature between 50° C. and 100° C.

Referring again to FIG. 2, the vapor distribution system 30, which forms part of and is coupled to the process chamber 10, comprises a vapor distribution plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34.

Once the process gas containing the Ru$_3$(CO)$_{12}$ precursor vapor enters the processing zone 33 of process chamber 10, the Ru$_3$(CO)$_{12}$ precursor vapor thermally decomposes upon adsorption at the substrate surface due to the elevated temperature of the substrate 25, and a conformal Ru metal layer is formed on the substrate 25. The substrate holder 20 is configured to elevate the temperature of the substrate 25 by virtue of the substrate holder 20 being coupled to a substrate temperature control system 22. For example, the substrate temperature control system 22 can be configured to elevate the temperature of the substrate 25 up to approximately 500° C. Additionally, the process chamber 10 can be coupled to a chamber temperature control system 12 configured to control the temperature of the chamber walls.

Metal precursor vaporization systems utilized for providing Ru$_3$(CO)$_{12}$ vapor have contemplated operating within a temperature range of approximately 40° C. to approximately 45° C. for Ru$_3$(CO)$_{12}$ under vacuum conditions in order to prevent decomposition, which occurs at higher temperatures. For example, Ru$_3$(CO)$_{12}$ can decompose at elevated temperatures to form by-products, such as those illustrated below:

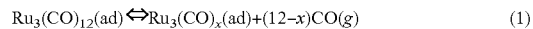  (1)

or,

  (2)

wherein these by-products can adsorb (ad), i.e., condense, on the interior surfaces of the deposition system 1. The accumulation of material on these surfaces can cause problems from one substrate to the next, such as process repeatability. Alternatively, for example, Ru$_3$(CO)$_{12}$ can condense on the internal surfaces of the deposition system 1, viz.

  (3).

In summary, the low vapor pressure of Ru$_3$(CO)$_{12}$ precursors and the small process window result in a very low deposition rate of a Ru metal layer on the substrate 25.

Vaporizing the Ru$_3$(CO)$_{12}$ precursor in the presence of CO gas can reduce the above-mentioned problems that limit the delivery of the Ru$_3$(CO)$_{12}$ precursor to the substrate. Thus, according to an embodiment of the invention, the CO gas is added to the Ru$_3$(CO)$_{12}$ precursor vapor by flowing the CO gas through or over the solid Ru$_3$(CO)$_{12}$ precursor in the metal precursor vaporization system 50 to reduce dissociation of the Ru$_3$(CO)$_{12}$ precursor vapor, thereby shifting the equilibrium in Equation (1) to the left and reducing premature decomposition of the Ru$_3$(CO)$_{12}$ precursor in the vapor precursor delivery system 40 prior to delivery of the Ru$_3$(CO)$_{12}$ precursor to the process chamber 10. It has been shown that addition of the CO gas to the Ru$_3$(CO)$_{12}$ precursor vapor allows for increasing the vaporization temperature from approximately 40° C. to approximately 100° C., or higher. The elevated temperature increases the vapor pressure of the Ru$_3$(CO)$_{12}$ precursor, resulting in increased delivery of the Ru$_3$(CO)$_{12}$ precursor to the process chamber and, hence, increased deposition rate of the Ru metal on the substrate 25. Furthermore, it has been visually observed that flowing a mixture of Ar and the CO gas over or through the Ru$_3$(CO)$_{12}$ precursor reduces premature decomposition of the Ru$_3$(CO)$_{12}$ precursor.

According to an embodiment of the invention, the addition of CO gas to a Ru$_3$(CO)$_{12}$ precursor vapor allows for maintaining the Ru$_3$(CO)$_{12}$ precursor vaporization temperature from approximately 40° C. to approximately 150° C. Alternately, the vaporization temperature can be maintained at approximately 60° C. to approximately 90° C.

Since the addition of the CO gas to the Ru$_3$(CO)$_{12}$ precursor vapor increases the thermal stability of the Ru$_3$(CO)$_{12}$ precursor vapor, the relative concentration of the Ru$_3$(CO)$_{12}$ precursor vapor to the CO gas in the process gas can be utilized to control the decomposition rate of the Ru$_3$(CO)$_{12}$ precursor on the substrate 25 at a certain substrate temperature. Furthermore, the substrate temperature can be utilized to control the decomposition rate (and thereby the deposition rate) of the Ru metal on the substrate 25. As those skilled in the art will readily appreciate, the amount of CO gas and the substrate temperature can easily be varied to allow for a desired vaporization temperature of the $Ru_3(CO)_{12}$ precursor and for achieving a desired deposition rate of the $Ru_3(CO)_{12}$ precursor on the substrate 25.

Furthermore, the amount of CO gas in the process gas can be selected so that Ru metal deposition on the substrate 25 from a $Ru_3(CO)_{12}$ precursor occurs in a kinetic-limited temperature regime (also commonly referred to as a reaction rate limited temperature regime). For example, the amount of CO gas in the process gas can be increased until the Ru metal deposition process is observed to occur in a kinetic-limited temperature regime. A kinetic-limited temperature regime refers to the range of deposition conditions where the deposition rate of a chemical vapor deposition process is limited by the kinetics of the chemical reactions at the substrate surface, typically characterized by a strong dependence of deposition rate on temperature. Unlike the kinetic-limited temperature regime, a mass-transfer limited regime is normally observed at higher substrate temperatures and includes a range of deposition conditions where the deposition rate is limited by the flux of chemical reactants to the substrate surface. A mass-transfer limited regime is characterized by a strong dependence of deposition rate on $Ru_3(CO)_{12}$ precursor flow rate and is independent of deposition temperature. Metal deposition in the kinetic-limited regime normally results in good step coverage and good conformality (uniform thickness) of the metal layer on patterned substrates.

Still referring to FIG. 2, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the metal precursor vaporization system 50, and the gas supply system 60.

Figure 3:
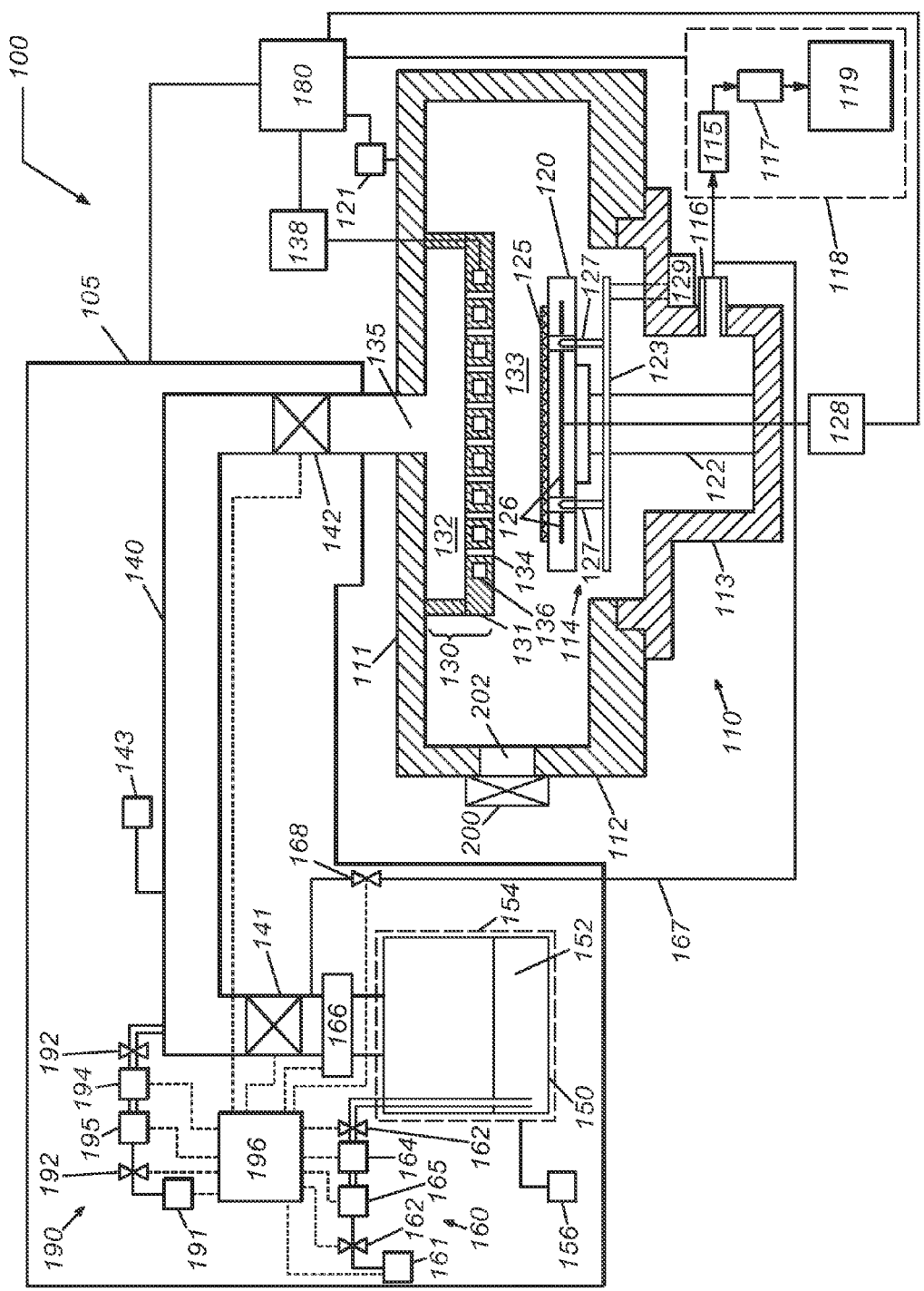
FIG. 3 depicts a schematic view of a TCVD system for depositing a Ru adhesion layer according to another embodiment of the invention.

FIG. 3 depicts a schematic view of a TCVD system for depositing a Ru adhesion layer with a $Ru_3(CO)_{12}$ precursor according to another embodiment of the invention. The deposition system 100 comprises a process chamber 110 having a substrate holder 120 configured to support a substrate 125 upon which the conformal Ru metal layer is formed. The process chamber 110 is coupled to a precursor delivery system 105 having metal precursor vaporization system 150 configured to store and vaporize a $Ru_3(CO)_{12}$ precursor 152, and a vapor precursor delivery system 140 configured to transport the vapor of the $Ru_3(CO)_{12}$ precursor 152 to the process chamber 110.

The process chamber 110 comprises an upper chamber section 111, a lower chamber section 112, and an exhaust chamber 113. An opening 114 is formed within lower chamber section 112, where bottom section 112 couples with exhaust chamber 113.

Still referring to FIG. 3, substrate holder 120 provides a horizontal surface to support substrate (or wafer) 125, which is to be processed. The substrate holder 120 can be supported by a cylindrical support member 122, which extends upward from the lower portion of exhaust chamber 113. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the substrate 125 or substrate holder 120.

During processing, the heated substrate 125 can thermally decompose the $Ru_3(CO)_{12}$ precursor vapor, and enable deposition of a Ru metal layer on the substrate 125. The substrate holder 120 is heated to a pre-determined temperature that is suitable for depositing the desired Ru metal layer onto the substrate 125. Additionally, a heater (not shown) coupled to a chamber temperature control system 121 can be embedded in the walls of process chamber 110 to heat the chamber walls to a pre-determined temperature. The heater can maintain the temperature of the walls of process chamber 110 from about 40° C. to about 150° C., or from about 40° C. to about 80° C. A pressure gauge (not shown) is used to measure the process chamber pressure. According to an embodiment of the invention, the process chamber pressure can be between about 1 mTorr and about 200 mTorr. Alternately, the process chamber pressure can be between about 2 mTorr and about 50 mTorr.

Also shown in FIG. 3, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

Furthermore, an opening 135 is provided in the upper chamber section 111 for introducing a $Ru_3(CO)_{12}$ precursor vapor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the $Ru_3(CO)_{12}$ precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C. For a $Ru_3(CO)_{12}$ precursor, the temperature of the vapor distribution plate 131 can be maintained at or above a temperature of about 65° C. to avoid precursor condensation on the plate 131.

As illustrated in FIG. 3, a metal precursor vaporization system 150 is configured to hold a $Ru_3(CO)_{12}$ precursor 152 and to evaporate (or sublime) the $Ru_3(CO)_{12}$ precursor 152 by elevating the temperature of the $Ru_3(CO)_{12}$ precursor. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. A precursor heater 154 is provided for heating the $Ru_3(CO)_{12}$ precursor 152 to maintain the $Ru_3(CO)_{12}$ precursor 152 at a temperature that produces a desired vapor pressure of $Ru_3(CO)_{12}$ precursor 152. The precursor heater 154 is coupled to a vaporization temperature control system 156 configured to control the temperature of the $Ru_3(CO)_{12}$ precursor 152. For example, the precursor heater 154 can be configured to adjust the temperature of the $Ru_3(CO)_{12}$ precursor 152 from about 40° C. to about 150° C., or from about 60° C. to about 90° C.

As the $Ru_3(CO)_{12}$ precursor 152 is heated to cause evaporation (or sublimation), a CO-containing gas can be passed over or through the $Ru_3(CO)_{12}$ precursor 152, or combination thereof. The CO-containing gas contains CO and optionally an inert carrier gas, such as $N_2$, or a noble gas (i.e., He, Ne, Ar, Kr, Xe). According to an embodiment of the invention, a CO gas can be added to the inert gas. Alternately, other embodiments contemplate the CO gas replacing the inert gas. For example, a gas supply system 160 is coupled to the metal precursor vaporization system 150, and it is configured to, for instance, flow the CO gas, the inert gas, or both, over or through the $Ru_3(CO)_{12}$ precursor 152. Although not shown in FIG. 3, gas supply system 160 can also or alternatively be coupled to the vapor precursor delivery system 140 to supply the carrier gas and/or CO gas to the vapor of the metal precursor 152 as or after it enters the vapor precursor delivery system 140. The gas supply system 160 can comprise a gas source 161 containing an inert carrier gas, a CO gas, or a mixture thereof, one or more control valves 162, one or more filters 164, and a mass flow controller 165. For instance, the mass flow rate of the CO-containing gas can range from approximately 0.1 sccm to approximately 1000 sccm.

Additionally, a sensor 166 is provided for measuring the total gas flow from the metal precursor vaporization system 150. The sensor 166 can, for example, comprise a mass flow controller, and the amount of $Ru_3(CO)_{12}$ precursor vapor delivered to the process chamber 110 can be determined using sensor 166 and mass flow controller 165. Alternately, the sensor 166 can comprise a light absorption sensor to measure the concentration of the $Ru_3(CO)_{12}$ precursor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the $Ru_3(CO)_{12}$ precursor vapor to the process chamber 110. In addition, a bypass valve 168, located downstream from the branching of the vapor precursor delivery system 140, is provided on bypass line 167.

Referring still to FIG. 3, the vapor precursor delivery system 140 comprises a high conductance vapor line having first and second valves 141 and 142, respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the $Ru_3(CO)_{12}$ precursor vapor in the vapor line. The temperature of the vapor lines can be controlled from about 20° C. to about 100° C., or from about 40° C. to about 90° C.

Moreover, a CO gas can be supplied from a gas supply system 190. For example, the gas supply system 190 is coupled to the vapor precursor delivery system 140, and it is configured to, for instance, mix the CO gas with the $Ru_3(CO)_{12}$ precursor vapor in the vapor precursor delivery system 140, for example, downstream of valve 141. The gas supply system 190 can comprise a CO gas source 191, one or more control valves 192, one or more filters 194, and a mass flow controller 195. For instance, the mass flow rate of CO gas can range from approximately 0.1 sccm to approximately 1000 sccm.

Mass flow controllers 165 and 195, and valves 162, 192, 168, 141, and 142 are controlled by controller 196, which controls the supply, shutoff, and the flow of the inert carrier gas, the CO gas, and the $Ru_3(CO)_{12}$ precursor vapor. Sensor 166 is also connected to controller 196 and, based on output of the sensor 166, controller 196 can control the carrier gas flow through mass flow controller 165 to obtain the desired $Ru_3(CO)_{12}$ precursor flow to the process chamber 110.

As illustrated in FIG. 3, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 500 liters per second (and greater). Alternately, the vacuum pump 119 can include a dry roughing pump. During processing, the process gas can be introduced into the process chamber 110, and the chamber pressure can be adjusted by the APC 115. The APC 115 can comprise a butterfly-type valve or a gate valve. The trap 117 can collect unreacted $Ru_3(CO)_{12}$ precursor material and by-products from the process chamber 110.

Referring back to the substrate holder 120 in the process chamber 110, as shown in FIG. 3, three substrate lift pins 127 (only two are shown) are provided for holding, raising, and lowering the substrate 125. The substrate lift pins 127 are coupled to plate 123, and can be lowered to below the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Still referring to FIG. 3, a controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 143, and vaporization temperature control system 156; vapor distribution temperature control system 138; vacuum pumping system 118; and substrate temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610™, available from Dell Corporation, Dallas, Tex.

The controller 180 may be implemented as a general purpose computer system that performs a portion or all of the microprocessor-based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 180 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 180, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 180 for execution. A computer readable medium may take many forms, including but not limited to, non-volatile media, volatile media, and transmission media. Non-volatile media includes, for example, optical disks, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 180.

The controller 180 may be locally located relative to the deposition system 100, or it may be remotely located relative to the deposition system 100. For example, the controller 180 may exchange data with the deposition system 100 using at least one of a direct connection, an intranet, the Internet or a wireless connection. The controller 180 may be coupled to an intranet at, for example, a customer site (i.e., a device maker, etc.), or it may be coupled to an intranet at, for example, a vendor site (i.e., an equipment manufacturer). Additionally, for example, the controller 180 may be coupled to the Internet. Furthermore, another computer (i.e., controller, server, etc.) may access, for example, the controller 180 to exchange data via at least one of a direct connection, an intranet, and the Internet. As also would be appreciated by those skilled in the art, the controller 180 may exchange data with the deposition system 100 via a wireless connection.

Figure 4A:
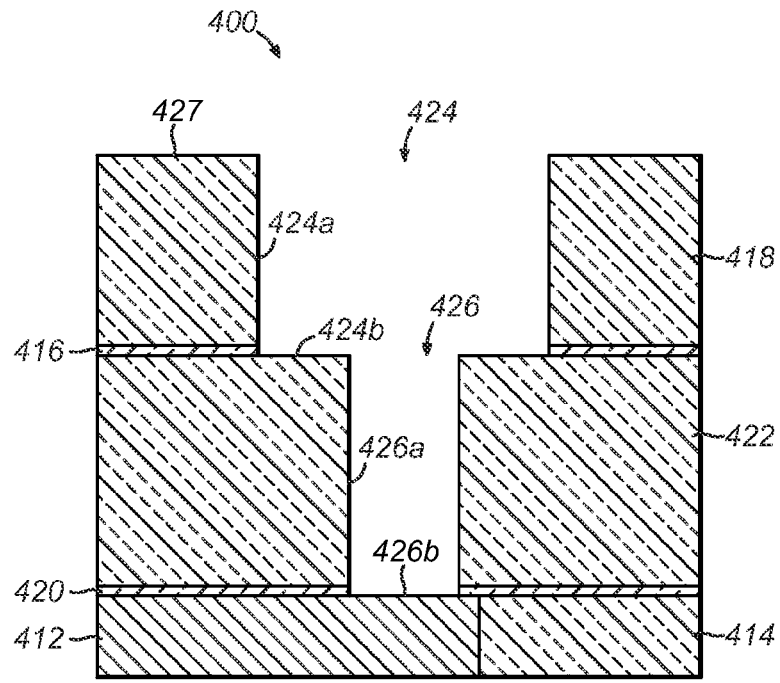
FIGS. 4A-4G show schematic cross-sectional views of the formation of a dual damascene patterned substrate containing a conformal Ru layer integrated with copper metallization according to an embodiment of the invention.
Figure 4B:
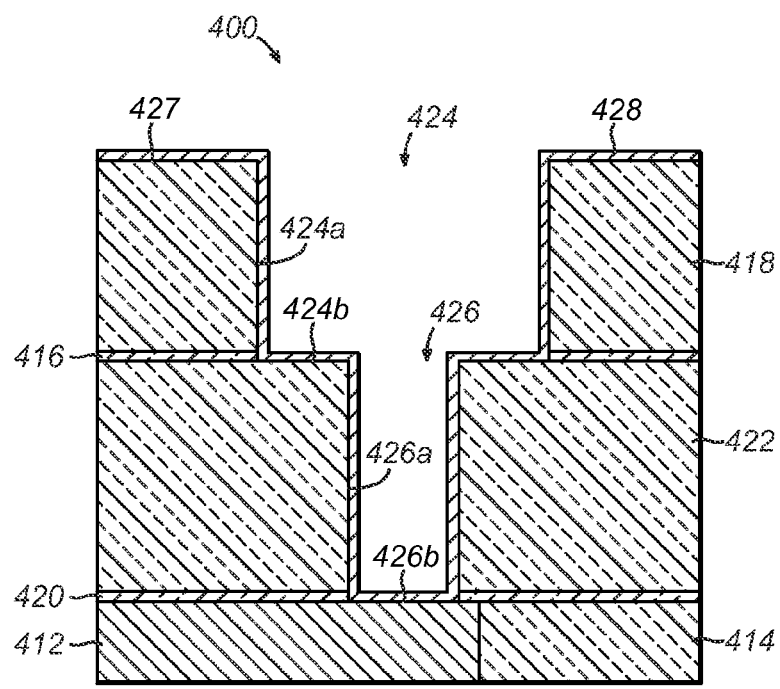
Figure 4C:
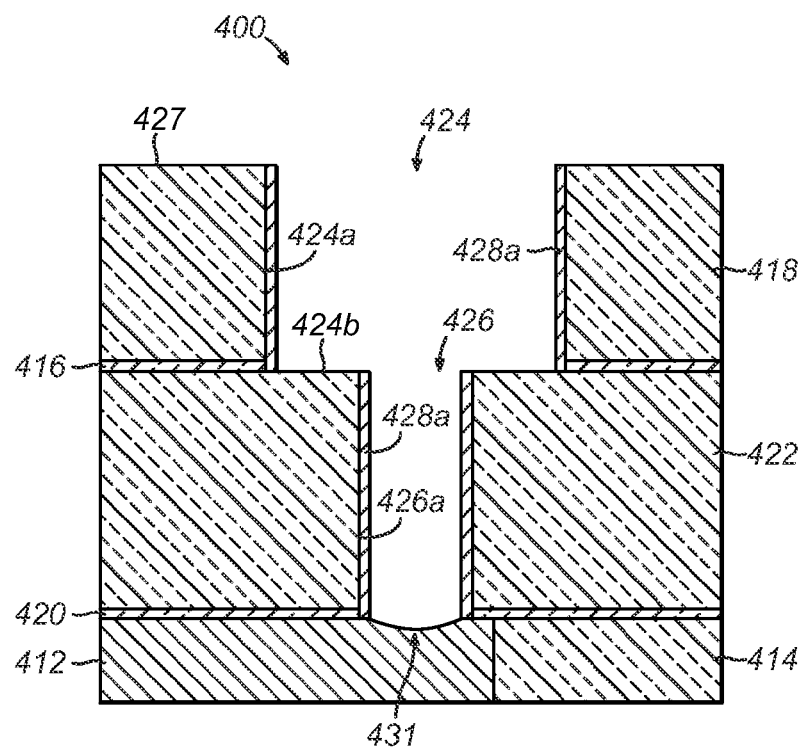
Figure 4D:
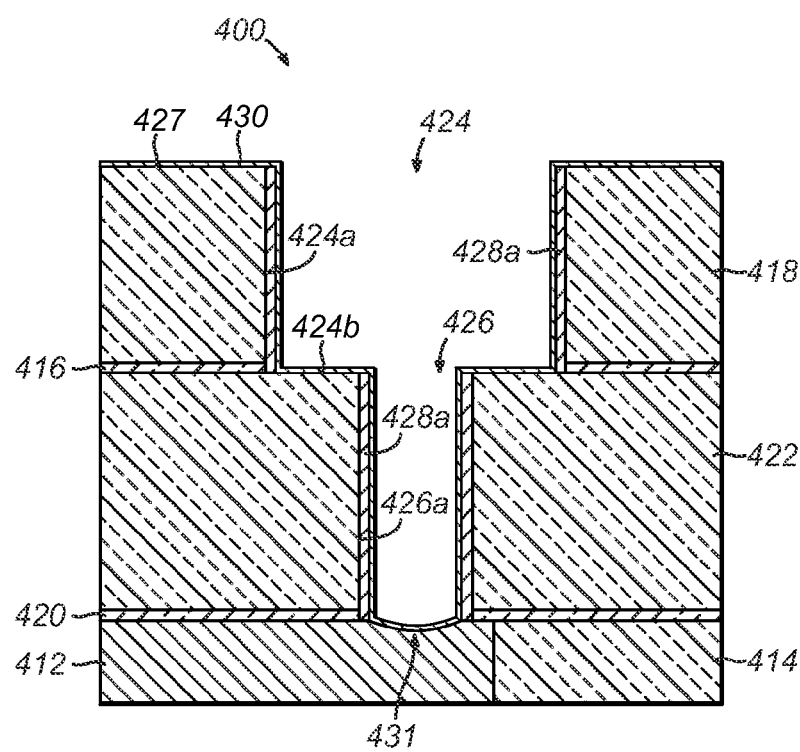
Figure 4E:
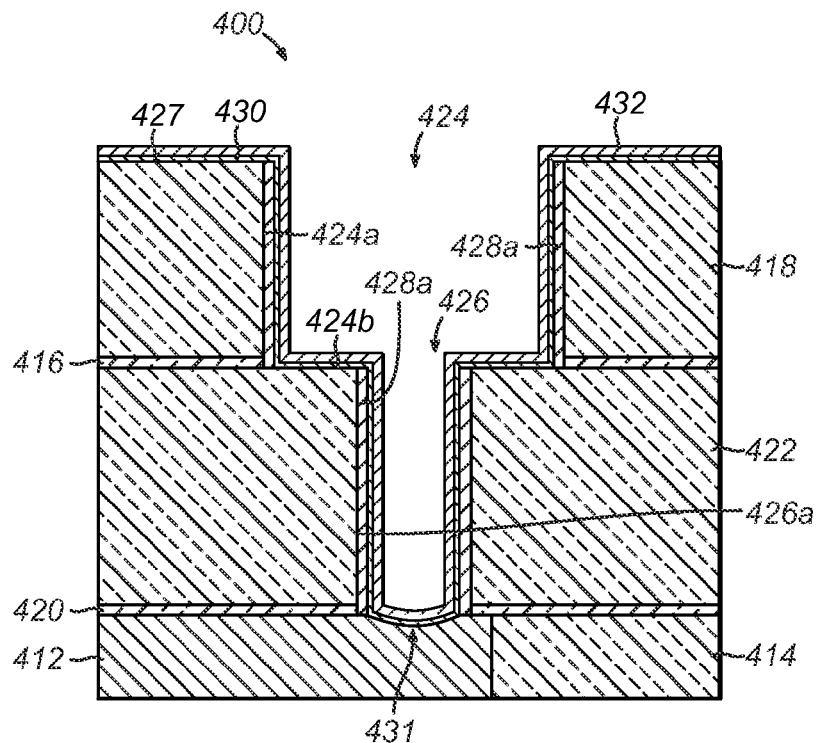
Figure 4F:
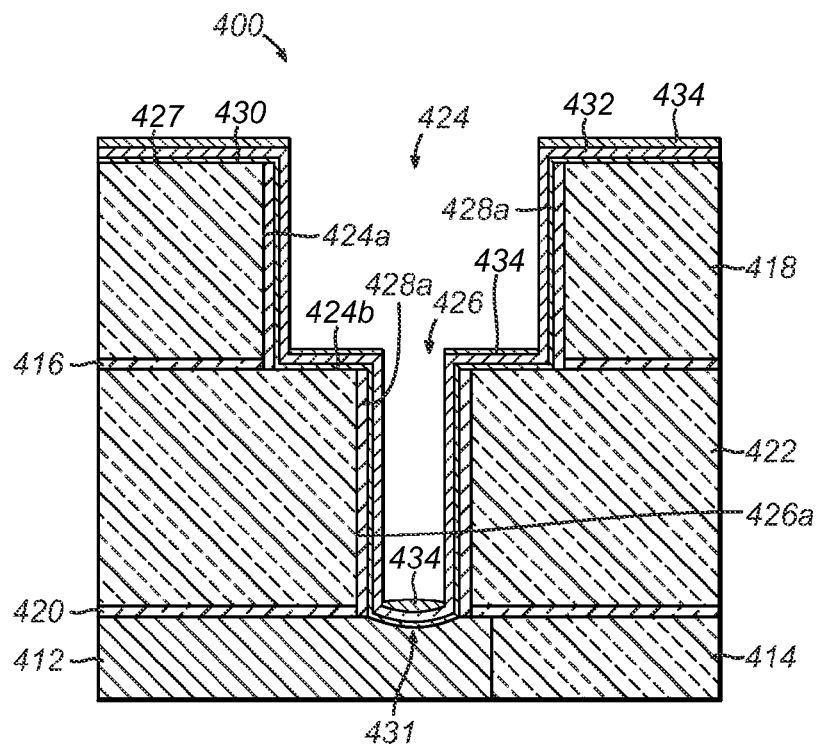
Figure 4G:
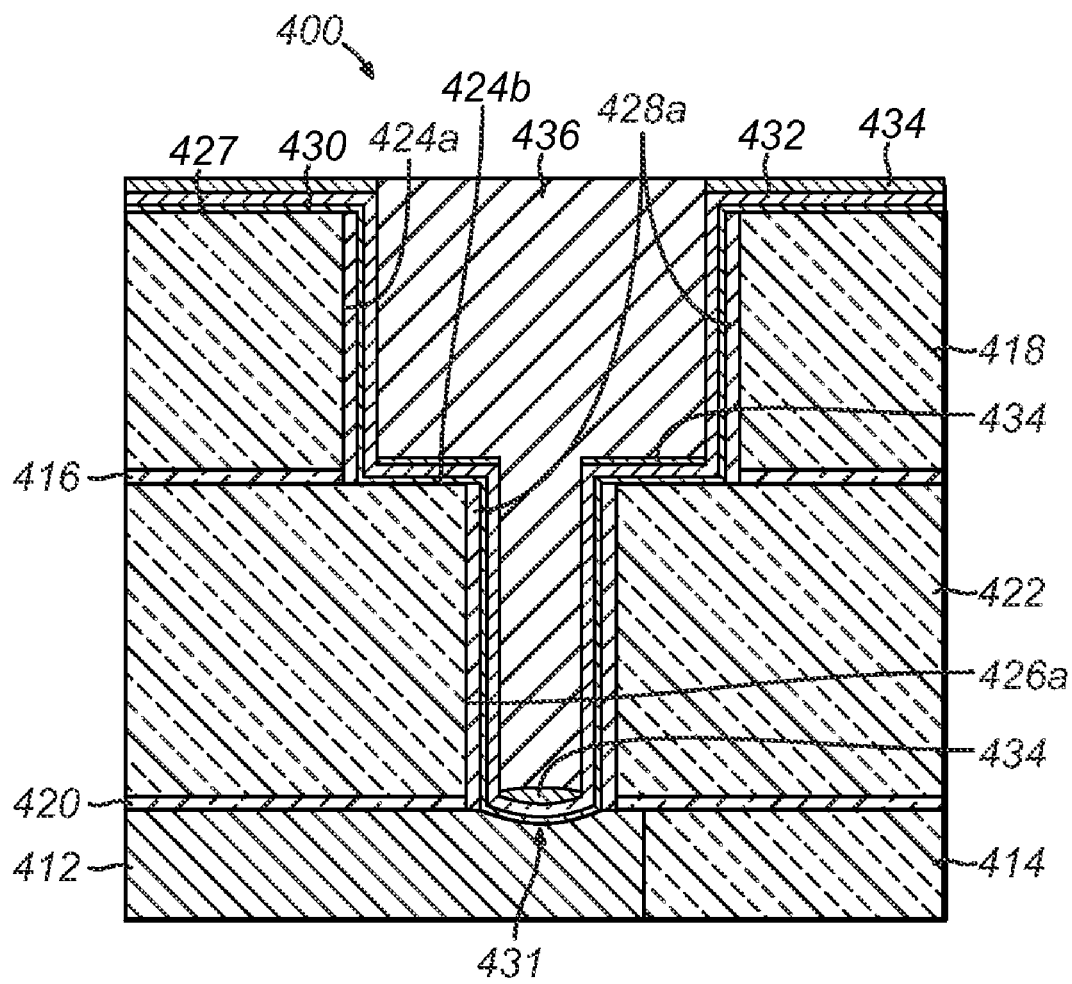
Figure 5:
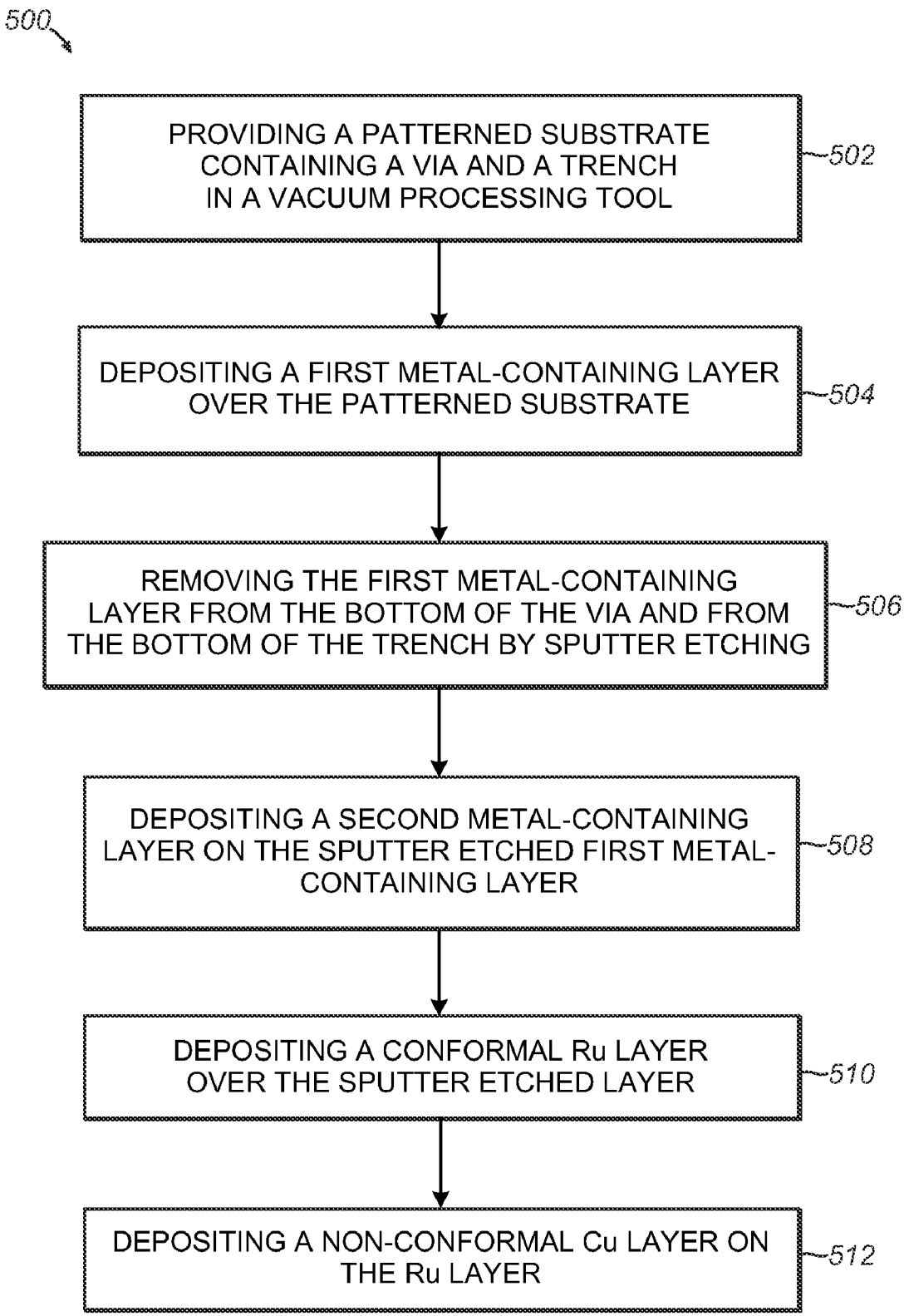
FIG. 5 is a process flow diagram for processing a patterned substrate according to an embodiment of the invention.

Reference will now be made to FIGS. 4A-4G, FIG. 5, and FIG. 1. FIGS. 4A-4G show schematic cross-sectional views of the formation of a dual damascene patterned substrate containing a conformal Ru layer integrated with copper metallization according to an embodiment of the invention. FIG. 5 is a process flow diagram for processing a patterned substrate according to an embodiment of the invention.

The process 500 of the process flow diagram shown in FIG. 5 may be performed using the vacuum processing tool 300 depicted in FIG. 1. In step 502, a patterned substrate 400 depicted in FIG. 4A containing a via 426 and a trench 424 is provided in the vacuum processing tool 300. The patterned substrate 400 can, for example, be loaded into the substrate loading chamber 320 and the substrate loading chamber 320 evacuated. The exemplary patterned substrate 400 depicted in FIG. 4A includes a dual damascene pattern containing a first metallization layer 412 (e.g., Cu), a dielectric (insulating layer) 414 (e.g., $SiO_2$, a low-k dielectric material such as fluorinated silicon glass (FSG), carbon doped oxide, a polymer, or any other suitable dielectric material), a trench etch stop layer 416 (e.g., SiN), a trench level dielectric 418 (e.g., $SiO_2$), a via etch stop 420 (e.g., SiN), a via level dielectric 422 (e.g., $SiO_2$), a trench 424 having a sidewall 424a and bottom 424b etched through the trench level dielectric 418, and a via 426 having a sidewall 426a and bottom 426b etched through the via level dielectric 422. The patterned substrate 400 can be formed using standard lithography and etching methods known to those skilled in the art. It will be understood that substrates with more complicated dual damascene patterns than the exemplary patterned substrate 400 may be employed.

Once evacuated, the patterned substrate 400 may be degassed and/or pre-cleaned as described above in reference to FIG. 1. Next, the patterned substrate 400 is transferred to the processing system 330 by the robotic transfer system 370. Once in the processing system 330, in step 504, a first metal-containing layer 428 is deposited over the patterned substrate 400. As depicted in FIG. 4B, the first metal-containing layer 428 conformally covers the "field" 427 (area around the trench 424), and the sidewalls (424a, 426a) and the bottoms (424b, 426b) of the trench 424 and the via 426. According to an embodiment of the invention, the first metal-containing layer 428 can contain a Ta-containing layer such as TaN, TaC, or TaCN, a Ti-containing layer such as Ti or TiN, or a W-containing layer such as W or WN. The first metal-containing layer 428 can, for example, have a thickness between about 0.5 and about 10 nm.

In step 506, the first metal-containing layer 428 is sputter etched to remove, substantially completely the first metal-containing layer 428 from the bottom 426b of the via 426 and from the bottom 424b of the trench 424. By "substantially completely" is meant that some particles or residue may remain, but that a continuous layer does not remain. In the embodiment depicted in FIG. 4C, the first metal-containing layer 428 is fully removed from the bottom 426b of the via 426, the bottom 424b of the trench 424, and the "field" 427 (area around the trench 424) but not from the sidewall area 424a of the trench 424 and the sidewall area 426a of the via 426. This is due to the lower sputter etch rates at the sidewalls. Thus, a sputter etched first metal-containing layer 428a remains on sidewalls 424a and 426a. At the bottom 426b of the via 426, a portion of the first metallization layer 412 may also be removed in area 431 by the sputter etching as depicted in FIG. 4C. According to one embodiment of the invention, the processing system 330 may be configured for both depositing the first metal-containing layer 428 in step 504 and performing the sputter etching step 506. The sputter etching can utilize Ar gas where a typical process pressure may include about 10 mTorr to about 10 Torr.

The removal of the first metal-containing layer 428 from the bottom 426b of the via 426 in step 506 provides a low electrical resistivity path between the first metallization layer 412 and a second metallization layer (i.e., Cu) that will fill the trench 424 and the via 426 (see FIG. 4G).

Once in the processing system 340, in step 508, a second metal-containing layer 430 may be deposited over the patterned substrate 400, specifically over sputter etched first metal-containing layer 428a, field 427, trench bottom 424b and area 431, as depicted in FIG. 4D. According to one embodiment of the invention, the second metal-containing layer can contain Ta, Ti, TiN, TaC, TaCN, W, or WN. The second metal-containing layer 430 can provide a metal-containing growth surface for a conformal Ru layer to be deposited onto the patterned substrate 400. In particular, as depicted in FIG. 4C, the first metal-containing layer 428 was removed from the field 427 and the bottom 424b of the trench 424, thereby leaving those areas void of the metal-containing layer 428. In addition, the second metal-containing layer 430 may provide a diffusion barrier for moisture out-diffusion from the dielectric materials of the patterned substrate 400.

Once in the processing system 350, in step 510, a conformal Ru layer 432 is deposited onto the patterned substrate 400. The conformal Ru layer 432 shown in FIG. 4E can be deposited in a thermal chemical vapor deposition process using a process gas containing $Ru_3(CO)_{12}$ and CO as described above in reference to FIGS. 2 and 3. According to one embodiment of the invention, the substrate can be maintained at a temperature between 120° C. and about 350° C. during the deposition of the conformal Ru layer 432. Alternately, a different Ru deposition technique and/or precursor may be used.

The current inventors have realized that a thin (<5 nm thick) conformal Ru layer has greatly improved diffusion resistance to Cu when the conformal Ru layer is deposited onto a metal-containing layer, such as the second metal-containing layer 430 (or the first metal-containing layer 428), compared to when the thin conformal Ru layer is deposited directly onto dielectric materials. Since the second metal-containing layer 430 is deposited onto the existing layers 424a and 426a on the sidewalls of the trench 424 and the via 426, the thickness of the second metal-containing layer 430 may be low in those areas compared to the areas 427 and 424b containing dielectric surfaces void of the first metal-containing layer 428. In one example, the minimum total thickness of the conformal Ru layer 432, the sputter etched first metal-containing layer 428a, and the second metal containing layer 430 can be between 1 nm and 10 nm. Alternately, the minimum total thickness can be between 1 nm and 5 nm. For example, a thickness of the conformal Ru layer 432 can be between 0.5 and 15 nm, for example 1 nm, 2 nm, 3 nm, or 4 nm.

Once in the processing system 360, in step 512, a non-conformal Cu layer 434 may be deposited on the conformal Ru layer 432. The non-conformal Cu layer 434 depicted in FIG. 4F can, for example, be deposited by IPVD. The thickness of the non-conformal Cu layer 434 can, for example, between about 1 nm and about 50 nm. When used with the conformal Ru layer 432, the non-conformal Cu layer 434 may be thinner than a conventional Cu seed layer used for Cu plating (e.g., a Cu seed layer on a Ta layer), where the thickness is commonly greater than about 50 nm. Importantly, little or no Cu metal needs to be deposited onto the Ru layer 432 inside the trench 424 and the via 426, since subsequent Cu plating may be performed directly onto the Ru layer 432 inside the trench 424 and the via 426. Therefore, the non-conformal Cu layer 434 may have very low step coverage, for example less than 10%. The non-conformal Cu layer 434 is thick on the "field", thereby providing a low-resistivity path for conducting current from the substrate edge to the entire substrate surface. As those skilled in the art will readily recognize, the amount of Cu metal deposited in the areas 424b and 426b will depend on the widths and depths of the trench 424 and the via 426. Furthermore, since scaling of future semiconductor devices will continue to ever smaller minimum feature sizes, trench and via widths will continue to decrease and trench and via depths will continue to increase. Therefore, the amount of Cu metal in the non-conformal Cu layer 434 inside the trenches and vias will continue to decrease. However, embodiments of the invention require little or no Cu metal to be deposited onto the Ru layer 432 inside the trench 424 and the via 426, thereby providing a method for successfully performing Cu metallization of the patterned substrate 400 for the future scaling of semiconductor devices. A role of the non-conformal Cu layer 434 includes reducing the terminal ('resistive substrate') effect that is commonly encountered in electrochemical plating processing where a non-uniform thickness of the plated Cu layer over the whole substrate (wafer) is observed. The terminal effect is the tendency for the current density to be non-uniform as a result of the ohmic potential drop associated with conducting current from the substrate edge to the entire substrate surface through a thin resistive layer. This problem can be more severe for a highly resistive non-Cu layer (e.g., Ru layer 432) than a lower resistivity Cu layer. The sheet resistance of a non-Cu layer can be orders of magnitude higher than that of today's Cu seed layers and straightforward extension of methods currently used to manipulate current distribution (e.g., electrolyte conductivity) generally may not be adequate to combat the terminal effect experienced using a non-Cu seed layer without the non-conformal Cu layer 434.

After performing steps 502-512, the patterned substrate 400 depicted in FIG. 4F can be exposed to air and subsequently a bulk Cu layer 436 plated onto the patterned substrate 400 and planarized using chemical mechanical polishing (CMP) to yield the patterned substrate 400 shown in FIG. 4G. Although least a portion of the non-conformal Cu layer 434 may become oxidized upon exposure to air, any oxidized Cu may be removed during the plating process.

Figure 6A:
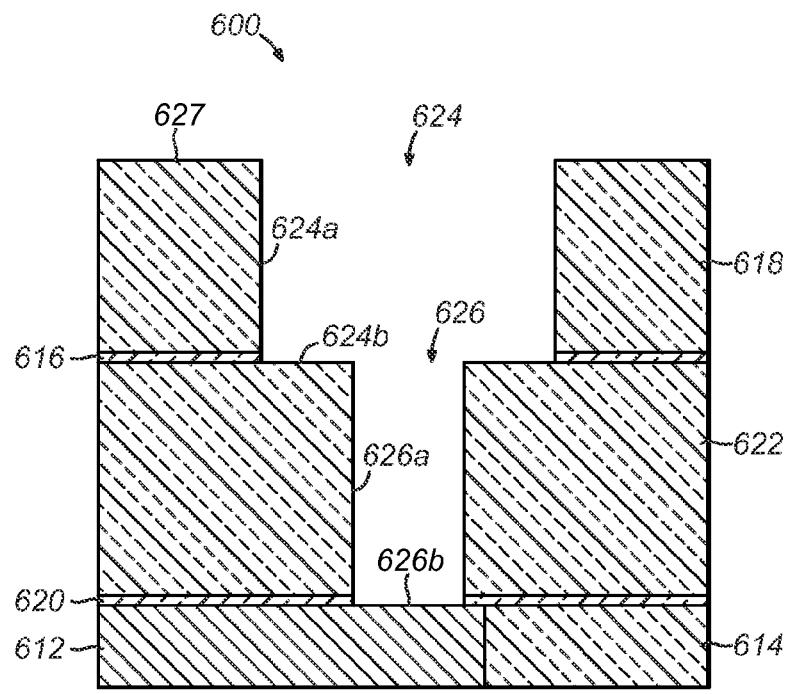
FIGS. 6A-6F show schematic cross-sectional views of the formation of a dual damascene patterned substrate containing a conformal Ru layer integrated with copper metallization according to an embodiment of the invention.
Figure 6B:
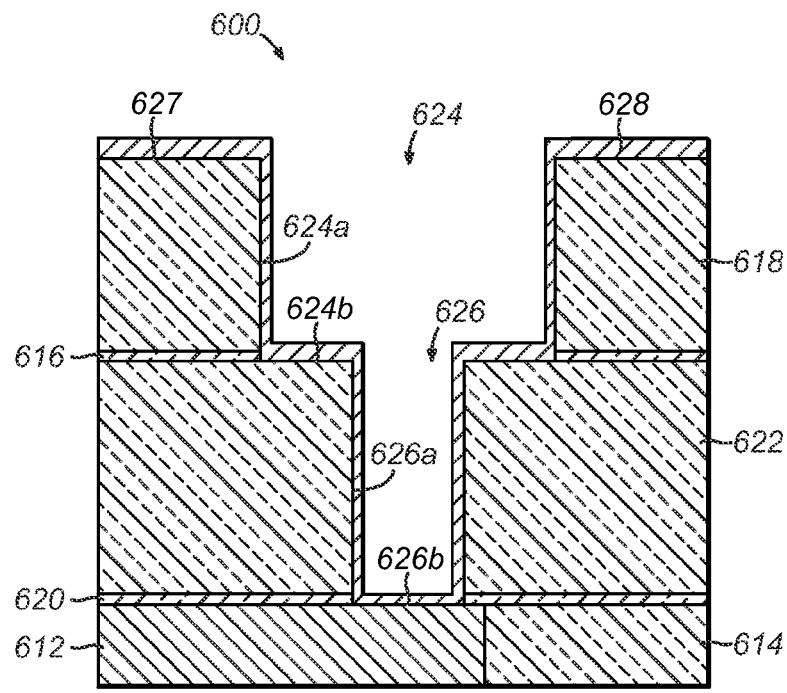
Figure 6C:
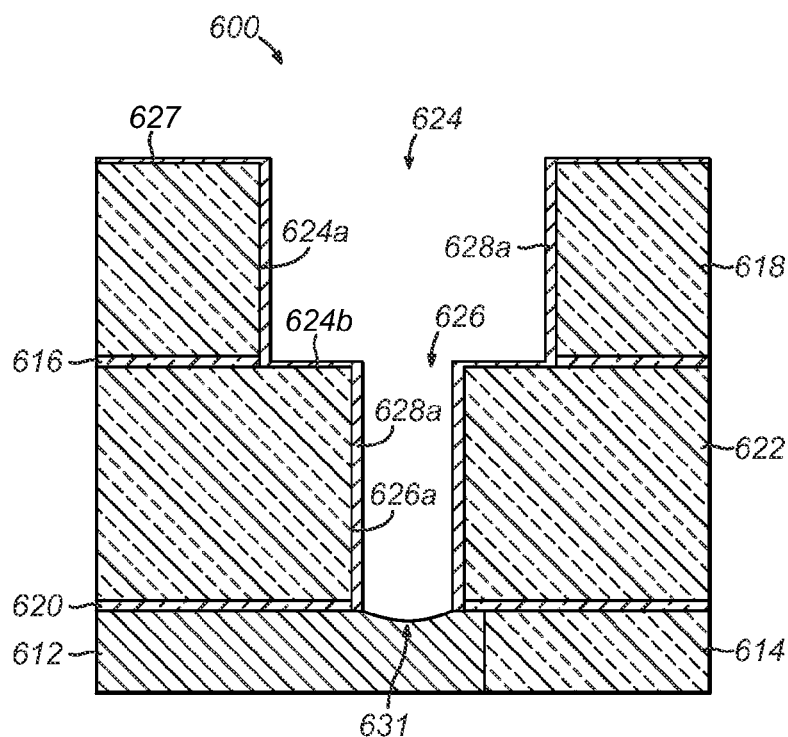
Figure 6D:
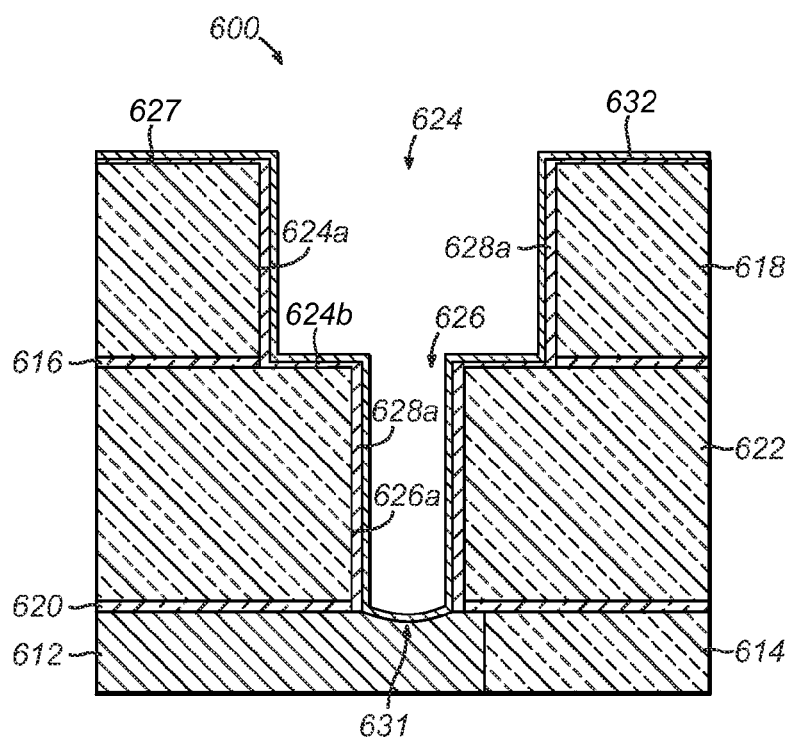
Figure 6E:
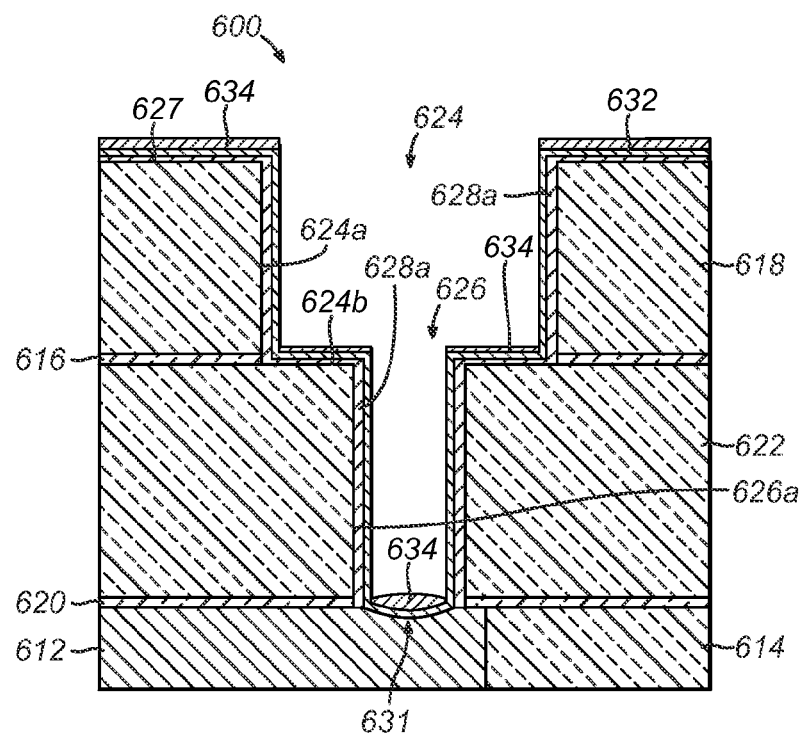
Figure 6F:
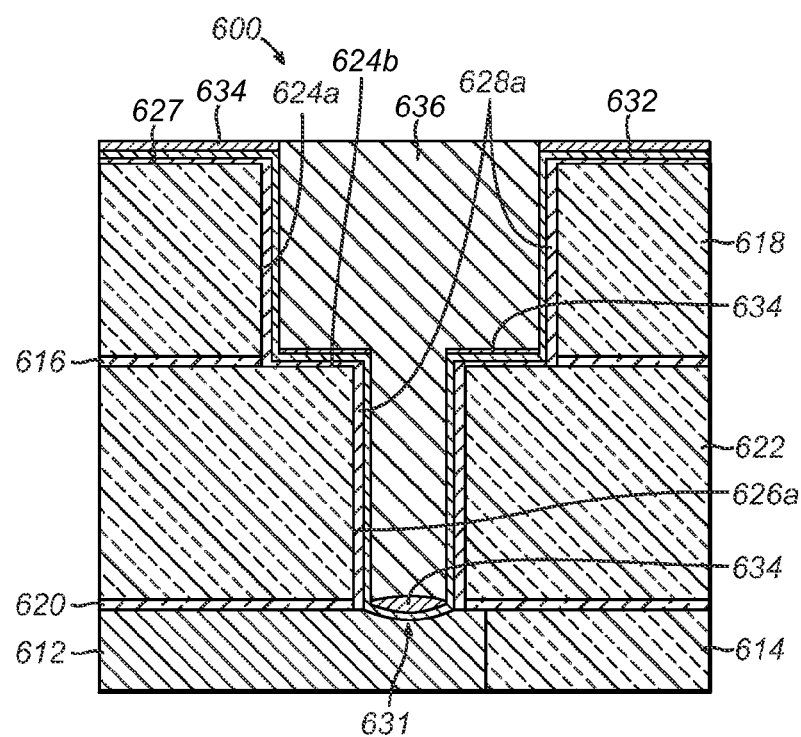
Figure 7:
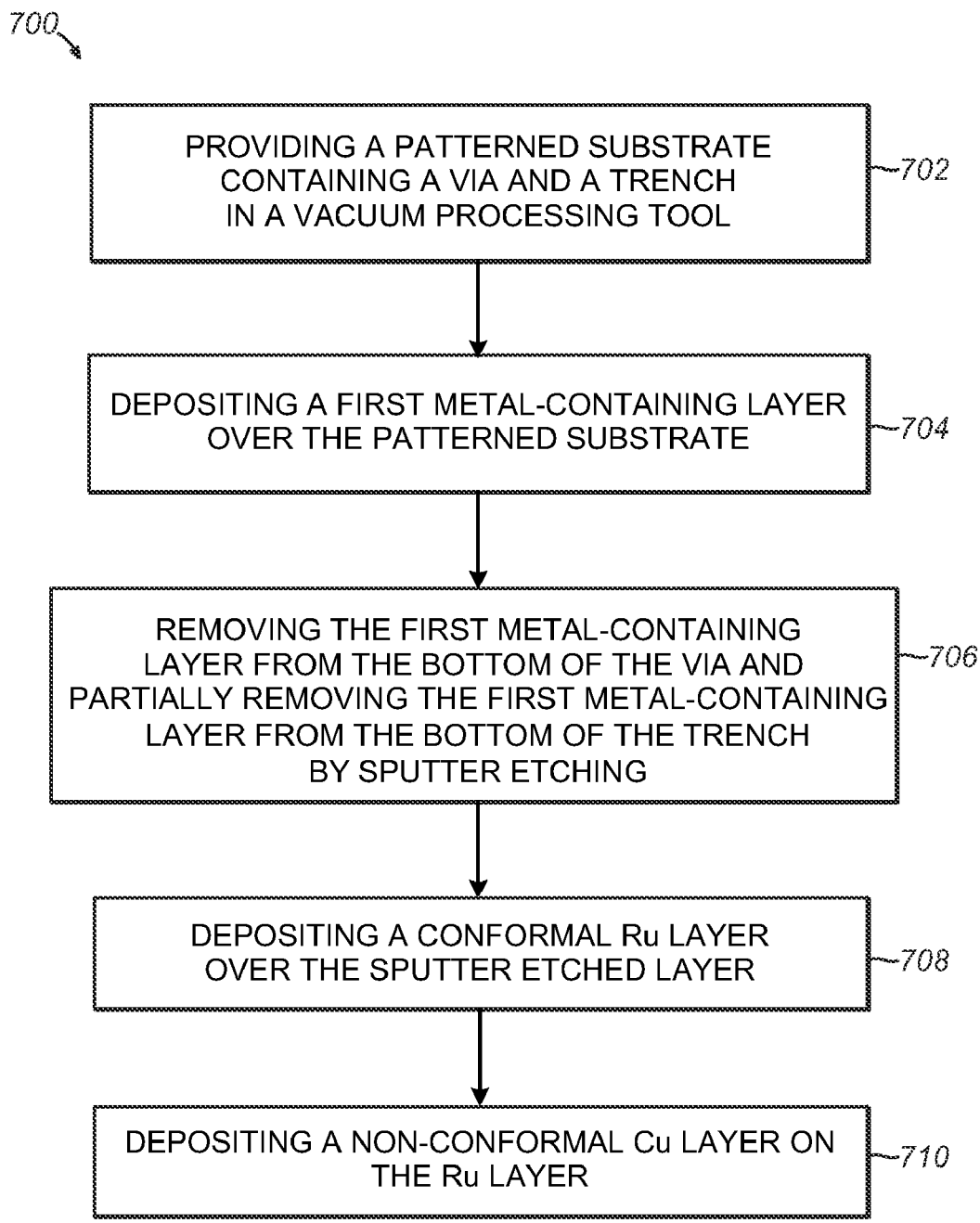
FIG. 7 is a process flow diagram for processing a patterned substrate according to an embodiment of the invention.

Reference will now be made to FIGS. 6A-6F, FIG. 7, and FIG. 1. FIGS. 5A-5F show schematic cross-sectional views of the formation of a dual damascene patterned substrate containing a conformal Ru layer integrated with copper metallization according to another embodiment of the invention. FIG. 7 is a process flow diagram for processing a patterned substrate according to an embodiment of the invention.

The process 700 of the process flow diagram shown in FIG. 7 may be performed using the vacuum processing tool 300 depicted in FIG. 1. In step 702, a patterned substrate 600 depicted in FIG. 5A containing a via 626 and a trench 624 is provided in the vacuum processing tool 300. The patterned substrate 600 can, for example, be loaded into the substrate loading chamber 320 and the substrate loading chamber 320 evacuated. The patterned substrate 600 includes a dual damascene pattern containing a first metallization layer 612 (e.g., Cu), a dielectric (insulating layer) 614 (e.g., $SiO_2$, a low-k dielectric material such as fluorinated silicon glass (FSG), carbon doped oxide, a polymer, or any other suitable dielectric material), a trench etch stop layer 616 (e.g., SiN), a trench level dielectric 618 (e.g., $SiO_2$), a via etch stop 620 (e.g., SiN), a via level dielectric 622 (e.g., $SiO_2$), a trench 624 having a sidewall 624a and bottom 624b etched through the trench level dielectric 618, and a via 626 having a sidewall 626a and bottom 626b etched through the via level dielectric 622.

Once evacuated, the patterned substrate 600 may be degassed and/or pre-cleaned as described above in reference to FIG. 1. Next, the patterned substrate 600 is transferred to the processing system 330 by the robotic transfer system 370.

Once in the processing system 330, in step 704, a first metal-containing layer 628 is deposited over the patterned substrate 600. Unlike the first metal-containing layer 428 depicted in FIG. 4B that conformally covers the field 427 and the sidewalls (424a, 426a) and the bottoms (424b, 426b) of the trench 424 and the via 426, the first metal-containing layer 628 depicted in FIG. 6B is non-conformal with greater thicknesses in the field 627 and trench bottom 624b than on the sidewalls (624a, 626a) of the trench 624 and via 626 and via bottom 626b. The first metal-containing layer 628 may be deposited by a deposition process that can provide non-conformal deposition, for example, an IPVD process.

In step 706, the patterned substrate 600 is sputter etched to remove the first metal-containing layer 628 from the bottom 626b of the via 626 and to partially remove the first metal-containing layer 628 from the bottom 624b of the trench 624 and the field 627, thereby forming sputter etched layer 628a that covers the field 627, the entire trench 624 and via sidewall 626. At the bottom 626b of the via 626, a portion of the first metallization layer 612 may be removed in area 631 as depicted in FIG. 6C. According to one embodiment of the invention, the processing system 330 may be configured for both depositing the first metal-containing layer 628 in step 704 and performing the sputter etching step 706.

Unlike the process flow 500 in FIG. 5, where a second metal-containing layer 430 was deposited onto the sputter etched patterned substrate 400, the process flow 700 depicted in FIG. 7 includes depositing a conformal Ru layer directly onto the first metal-containing layer 628a without depositing a second metal-containing layer. Unlike in FIG. 4C, where the first metal-containing layer 428 was fully removed from the areas 427 and 424b, the sputter etched first metal-containing layer 628a in FIG. 6C still contains at least a portion of the first metal-containing layer 628 on the bottoms (624b, 626b) and the sidewalls (624a, 626a) of the trench 624 and via 626, thereby allowing for omitting the deposition of a second metal-containing layer.

Alternately, since the first metal-containing layer 628 is non-conformal and may have poor coverage on the sidewalls (624a, 626a) of the trench 624 and via 626, a second conformal metal-containing layer (not shown) may be deposited before the first metal-containing layer 628, followed by depositing the first metal-containing layer 628 thereon and sputter etching both the first and second metal-containing layers to substantially completely remove the layers from the bottom 626b of the via 626 and at least partially from the bottom 624b of the trench 624, and then followed by deposition of the conformal Ru layer 632. As described above in reference to FIG. 4D, a conformal Ru layer has greatly improved diffusion resistance to Cu when the conformal Ru layer is deposited onto a metal-containing layer compared to when the thin conformal Ru layer is deposited directly onto dielectric materials.

In one example, the minimum total thickness of the conformal Ru layer 632, and the sputter etched first metal-containing layer 628a, can be between about 1 nm and about 10 nm. Alternately, the minimum total thickness can be between about 1 nm and about 5 nm. For example, a thickness of the conformal Ru layer 632 can be between about 0.5 and about 15 nm, for example 1 nm, 2 nm, 3 nm, or 4 nm. Alternately, according to another embodiment of the invention, a second metal-containing layer may be deposited onto the sputter etched first metal-containing layer 628a depicted in FIG. 6C prior to depositing a conformal Ru layer.

Once in the processing system 350, in step 708, a conformal Ru layer 632 is deposited onto the patterned substrate 600. The conformal Ru layer 632 shown in FIG. 6D can be deposited in a thermal chemical vapor deposition process using a process gas containing $Ru_3(CO)_{12}$ and CO as described above in reference to FIGS. 2 and 3. According to one embodiment of the invention, the substrate can be maintained at a temperature between about 120° C. and about 350° C. during the deposition of the conformal Ru layer 632. Alternately, a different Ru deposition technique and/or precursor may be used.

Next, once in the processing system 360, in step 710, a non-conformal Cu layer 634 may be deposited on the conformal Ru layer 632. The non-conformal Cu layer 634 depicted in FIG. 6E can, for example, be deposited by IPVD. The thickness of the non-conformal Cu layer 634 can, for example, between about 1 nm and about 50 nm.

After performing steps 702-710, the patterned substrate 600 depicted in FIG. 6E can be exposed to air and subsequently a bulk Cu layer 636 plated onto the patterned substrate 600 and planarized using chemical mechanical polishing (CMP) to yield the patterned substrate 600 shown in FIG. 6F.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of integrated substrate processing in a vacuum processing tool, comprising:
   providing a patterned substrate containing a via having a sidewall and a bottom and a trench having a sidewall and a bottom in the vacuum processing tool; and
   performing an integrated process on the patterned substrate in the vacuum processing tool, the process comprising:
   depositing a first metal-containing layer over the patterned substrate;
   removing the first metal-containing layer substantially completely from the bottom of the via and at least partially from the bottom of the trench by sputter etching to leave a sputter etched first metal-containing layer on a portion of the patterned substrate;
   depositing a conformal Ru layer over the patterned substrate including onto the sputter etched first metal-containing layer;
   depositing a non-conformal Cu layer onto the conformal Ru layer; and
   plating Cu over the patterned substrate.

2. The method according to claim 1, wherein the depositing a first metal-containing layer comprises depositing a Ta-containing layer, a Ti-containing layer, or a W-containing layer.

3. The method according to claim 1, wherein the depositing a first metal-containing layer comprises depositing Ta, TaN, TaC, TaCN, Ti, TiN, W, or WN.

4. The method according to claim 1, wherein the removing comprises exposing the patterned substrate to an Ar sputter etch.

5. The method according to claim 1, wherein a minimum total thickness of the conformal Ru layer and the sputter etched first metal-containing layer is between about 1 nm and about 10 nm.

6. The method according to claim 1, wherein the depositing a conformal Ru layer is achieved by a thermal chemical vapor deposition process using a process gas containing $Ru_3(CO)_{12}$ vapor and CO gas.

7. The method according to claim 1, wherein the via has an aspect ratio of at least 5:1.

8. The method according to claim 1, wherein the via has an aspect ratio of at least 10:1.

9. The method according to claim 1, wherein the via has an aspect ratio of at least 15:1.

10. The method according to claim 1, further comprising, prior to the depositing a first metal-containing layer, depositing a conformal second metal-containing layer over the patterned substrate wherein the first metal-containing layer is deposited over the conformal second metal-containing layer, and wherein the removing comprises removing the first and second metal-containing layers substantially completely from the bottom of the via and at least partially from the bottom of the trench by sputter etching to leave sputter etched first and second metal-containing layers on a portion of the patterned substrate.

11. The method according to claim 1, wherein the depositing a first metal-containing layer is performed in a first processing system, the removing is performed in a second processing system, the depositing a conformal Ru layer is performed in a third processing system, and the depositing a non-conformal Cu layer is performed in a fourth processing system, and wherein the first, second, third and fourth processing systems are each coupled to a robotic transfer system in the vacuum processing tool, the method further comprising transferring the patterned substrate between the first, second, third and fourth processing systems by the robotic transfer system under vacuum.

12. The method according to claim 1, wherein the depositing a first metal-containing layer and the removing are performed in a first processing system, the depositing a conformal Ru layer is performed in a second processing system, and the depositing a non-conformal Cu layer is performed in a third processing system, and wherein the first, second, and third processing systems are each coupled to a robotic transfer system in the vacuum processing tool, the method further comprising transferring the patterned substrate between the first, second, and third processing systems by the robotic transfer system under vacuum.

13. The method according to claim 1, further comprising, prior to depositing the conformal Ru layer, depositing a second metal-containing layer over the patterned substrate, including onto the sputter etched first metal-containing layer.

14. The method according to claim 13, wherein the depositing a second metal-containing layer comprises depositing a Ta layer, a Ti layer, a TiN layer, a TaC layer, TaCN layer, a W layer, or a WN layer.

15. The method according to claim 13, wherein the first metal-containing layer comprises TaN or TaCN and the second metal-containing layer comprises Ta or Ti.

16. The method according to claim 13, wherein a minimum total thickness of the conformal Ru layer, the sputter etched first metal-containing layer, and the second metal-containing layer is between about 1 nm and about 10 nm.

17. The method according to claim 13, wherein a minimum total thickness of the conformal Ru layer, the sputter etched first metal-containing layer, and the second metal-containing layer is between about 1 nm and about 5 nm.

18. The method according to claim 1, wherein the removing comprises removing by sputter etching the first metal-containing layer substantially completely from the bottom of the via and from the bottom of the trench, and the method further comprises depositing a second metal-containing layer over the patterned substrate including onto the sputter etched first metal-containing layer.

19. The method according to claim 18, wherein the depositing a second metal-containing layer comprises depositing a Ta layer, a Ti layer, a TiN layer, a TaC layer, TaCN layer, or a W layer.

20. A method of integrated substrate processing in a vacuum processing tool, comprising:
providing a patterned substrate containing a via having a sidewall and a bottom and a trench having a sidewall and a bottom in the vacuum processing tool; and
performing an integrated process on the patterned substrate in the vacuum processing tool, the process comprising:
depositing a first metal-containing layer over the patterned substrate;
removing the first metal-containing layer substantially completely from the bottom of the via and at least partially from the bottom of the trench by sputter etching to leave a sputter etched first metal-containing layer on a portion of the patterned substrate;
depositing a conformal Ru layer over the patterned substrate including onto the sputter etched first metal-containing layer by a thermal chemical vapor deposition process using a process gas containing $Ru_3(CO)_{12}$ vapor and CO gas, wherein the depositing a conformal Ru layer comprises:
heating a solid $Ru_3(CO)_{12}$ precursor to a temperature between about 30° C. and about 130° C. in a precursor container while flowing the CO gas over or through the solid $Ru_3(CO)_{12}$ precursor to form the process gas;
transporting the process gas from the precursor container to a process chamber containing the patterned substrate by flowing the process gas through a heated gas line fluidly connecting the precursor container to the process chamber; and
exposing the patterned substrate to the process gas while maintaining the substrate at a temperature between about 120° C. and about 350° C. and maintaining the process chamber pressure between about 1 mTorr and about 200 mTorr;
depositing a non-conformal Cu layer onto the conformal Ru layer; and
plating Cu over the patterned substrate.

21. A method of integrated substrate processing in a vacuum processing tool, comprising:
providing a patterned substrate containing a via having a sidewall and a bottom and a trench having a sidewall and a bottom in the vacuum processing tool; and
performing an integrated process on the patterned substrate in the vacuum processing tool, the process comprising:
depositing a first metal-containing layer over the patterned substrate;
removing the first metal-containing layer substantially completely from the bottom of the via and from the bottom of the trench, by sputter etching to leave a sputter etched first metal-containing layer on a portion of the patterned substrate;
depositing a second metal-containing layer over the patterned substrate, including onto the sputter etched first metal-containing layer;
depositing a conformal Ru layer over the patterned substrate, including onto the second metal-containing layer in a thermal chemical vapor deposition process using a process gas containing $Ru_3(CO)_{12}$ vapor and CO gas; and
depositing a non-conformal Cu layer on the conformal Ru layer.

22. The method according to claim 21, wherein at least one of the first and second metal-containing layers comprise Ta, Ti, W, TaC, TaN, TaCN, TiN or WN.

23. The method according to claim 21, wherein a minimum total thickness of the conformal Ru layer, the sputter etched first metal-containing layer, and the second metal-containing layer is between about 1 nm and about 5 nm.

24. The method according to claim 21, wherein the depositing a conformal Ru layer comprises:
heating a solid $Ru_3(CO)_{12}$ precursor to a temperature between about 30° C. and about 130° C. in a precursor container while flowing the CO gas over or through the solid $Ru_3(CO)_{12}$ precursor to form the process gas;
transporting the process gas from the precursor container to a process chamber containing the patterned substrate by flowing the process gas through a heated gas line fluidly connecting the precursor container to the process chamber; and
exposing the patterned substrate to the process gas while maintaining the substrate at a temperature between about 120° C. and about 350° C. and maintaining the process chamber pressure between about 1 mTorr and about 200 mTorr.

25. The method according to claim 21, wherein the depositing a first metal-containing layer and the removing are performed in a first processing system, the depositing a second metal-containing layer is performed in a second processing system, the depositing a conformal Ru layer is performed in a third processing system, and the depositing a non-conformal Cu layer is performed in a fourth processing system, and wherein the first, second, third and fourth processing systems are each coupled to a robotic transfer system in the vacuum processing tool, the method further comprising transferring the patterned substrate between the first, second, third and fourth processing systems by the robotic transfer system under vacuum.

26. The method according to claim 21, wherein the depositing a first metal-containing layer is performed in a first processing system, the removing is performed in a second processing system, the depositing a second metal-containing layer is performed in the first processing system, the depositing a conformal Ru layer is performed in a third processing system, and the depositing a non-conformal Cu layer is performed in a fourth processing system, and wherein the first, second, third and fourth processing systems are each coupled to a robotic transfer system in the vacuum processing tool, the method further comprising transferring the patterned substrate between the first, second, third and fourth processing systems by the robotic transfer system under vacuum.

27. The method according to claim 21 further comprising plating bulk Cu over the patterned substrate to fill the via and the trench.

* * * * *

UNITED STATES PATENT AND TRADEMARK OFFICE
CERTIFICATE OF CORRECTION

PATENT NO. : 7,432,195 B2
APPLICATION NO. : 11/277908
DATED : October 7, 2008
INVENTOR(S) : Kenji Suzuki It is certified that error appears in the above-identified patent and that said Letters Patent is hereby corrected as shown below:

Col. 4, line 6, "may exposed to" should read --may be exposed to--.

Col. 6, line 67, "3 mtorr" should read --3 mTorr--.

Col. 15, line 52, "can, for example," should read --can be, for example,--.

Col. 16, line 35, "Although least." should read --Although at least--.

Col. 18, line 2, "$Ru_3(CO)12$" should read --$Ru_3(CO)_{12}$--.

Signed and Sealed this

Third Day of November, 2009

David J. Kappos
*Director of the United States Patent and Trademark Office*